United States Patent [19]
Yazaki

[11] Patent Number: 4,716,442
[45] Date of Patent: Dec. 29, 1987

[54] EXPOSURE DEVICE AND EXPOSURE CONTROL METHOD

[75] Inventor: Yoshio Yazaki, Chofu, Japan
[73] Assignee: ORC Manufacturing Co., Ltd., Tokyo, Japan
[21] Appl. No.: 832,436
[22] Filed: Feb. 24, 1986
[30] Foreign Application Priority Data
  Feb. 22, 1985 [JP]  Japan .................................. 60-34162
[51] Int. Cl.⁴ .......................................... G03B 27/72
[52] U.S. Cl. ................................... 355/67; 355/71
[58] Field of Search .............................. 355/67, 71
[56] References Cited

U.S. PATENT DOCUMENTS

| | | | |
|---|---|---|---|
| 3,241,437 | 3/1966 | Thiels | 355/67 |
| 4,090,788 | 5/1978 | Massengeil | 355/71 |
| 4,113,379 | 9/1978 | Harada et al. | 355/71 |
| 4,171,905 | 10/1979 | Boschet | 355/67 |
| 4,194,835 | 3/1980 | Shiode | 355/67 |

*Primary Examiner*—Monroe H. Hayes
*Attorney, Agent, or Firm*—Fidelman & Wolffe

[57] ABSTRACT

In an exposure device, the light rays emitted from a light source and radiated at an illumination surface, the light rays directly incident to the illuminated surface, the light rays incident to the illuminated surface at greater angles of incidents and the light rays which cause the overexposure of the object to be exposed are interrupted by an optical shielding plate interposed between the light source and the illuminated surface so that the unwanted light rays can be cut-off.

The illuminated surface has a specific illumination distribution pattern inherent to the light source used so that the integrated quantities of light rays each incident to each point on the surface of the object to be exposed do not become uniform. According to the present invention, the object to be exposed or reciprocated across the illuminated surface and the angular position of the light sources varied in the forward and return strokes so that the illumination distribution pattern of the exposure light emitted from the light source is also varied. In addition, upon rotation of the light source an angle of incidents of each exposure light ray which is not perpendicular to the surface of the object to be exposed is inclined to the opposite direction to the surface of the object to be exposed.

4 Claims, 11 Drawing Figures (a)

(b)

(a)

(b)

ured precision so that it is preferable to used a point

EXPOSURE DEVICE AND EXPOSURE CONTROL METHOD

BACKGROUND OF THE INVENTION

The present invention relates to an exposure device for exposing an object to be exposed such as a photographic printing plate or a printed circuit board and an exposure control method when such exposure device as described above is used.

In the case of a contact exposure printing, the lines of an original pattern must be reproduced with a high degree of precision so that it is preferable to used a point light source as an exposure light source capable of emitting parallel light rays resulting in a high degree of resolution.

However, in practice, it is now impossible to obtain such ideal point light source and even if a light source substantially similar to a point light source is provided, a sufficient quantity of light for exposure cannot be obtained.

Therefore, so far a line light source such as a high-pressure mercury-vapor lamp which has some length and can emit a sufficient quantity of light for exposure has long been used as an exposure light source.

In an exposure light source utilizing such line light source, the line light source is located at the focal point of a reflecting mirror such as a parabolic mirror or a deformed elliptical mirror so that a sufficient quantity of light for exposure may be obtained.

The exposure light source utilizing a line light source can ensure a sufficient quantity of light for exposure, but since the light source is a line light source, the light rays capable of exposure are emitted from the portions of the line light source other than the center portion thereof which is located at the focal point of the reflecting mirror and there exist the light rays which arrives at the surface of an object to be exposed at random angles of incidence. As a result, the parallelism of the light rays emitted from the exposure light source is unsatisfactory so that the resolution is remarkably degraded.

Various means for correcting the parallelism have been devised and used. For instance, an optical system comprising lenses and reflecting mirrors is used. However, these means are complex in construction and need a large installation space.

As is well known in the art, an illumination distribution pattern defined by a line light source is not uniform as compared with an illumination distribution pattern defined by a point light source. That is, a non-uniform illumination distribution pattern defined by a line light source is such that the illumination is high in the direction perpendicular to the axis of the line light source while the illumination is weak in the direction of the axis of the light source. As a result, the illumination distribution pattern on a surface illuminated (to be referred as "an illuminated surface" hereinafter in this specification) by the light rays emitted from the line light source and reflected back by a reflecting mirror is not uniform so that the degree of exposure at each point on the surface of an object to be exposed; that is, the quantity of light incident at each point on the surface of the object to be exposed, is not uniform. As a result, the surface of the object to be exposed has over-exposed portions and under-exposed portions so that a large quantity of unsatisfactorily exposed objects or media is produced.

SUMMARY OF THE INVENTION

The present invention was made to overcome and eliminate the problems and defects encountered in the prior art exposure devices. Briefly stated, according to the present invention, of the light rays emitted from a line light source and radiated toward an illuminated surface, the light rays which adversely affect an exposure of an object to be exposed are interrupted by an optical shielding plate formed integral with the line light source so that the exposure light rays become substantially parallel with each other. Furthermore, the position of the exposure light source is rotated relative to the object to be exposed so that the non-uniformity of the quantity of light incident to the illuminated surface due to the non-uniformity of the illumination distribution can be eliminated.

One of the objects of the present invention is therefore to increase the resolution of lines by interrupting the light rays which are not wanted or desired for proper exposure.

Another object of the present invention is to distribute the exposure light rays as uniformly as possible over the surface of an object to be exposed so that the object is satisfactorily exposed.

A further object of the present invention is to rotate a light source relative to an object to be exposed so that the slight inclination relative to the vertical of the exposure light rays incident on the surface of the object to be exposed is eliminated, whereby a high degree of line resolution can be attained.

The above and other objects, effects and features of the present invention will become more apparent from the following description of some preferred embodiments thereof taken in conjunction with the accompanying drawings.

DETAILED DESCRIPTION OF THE INVENTION

Figure 1:
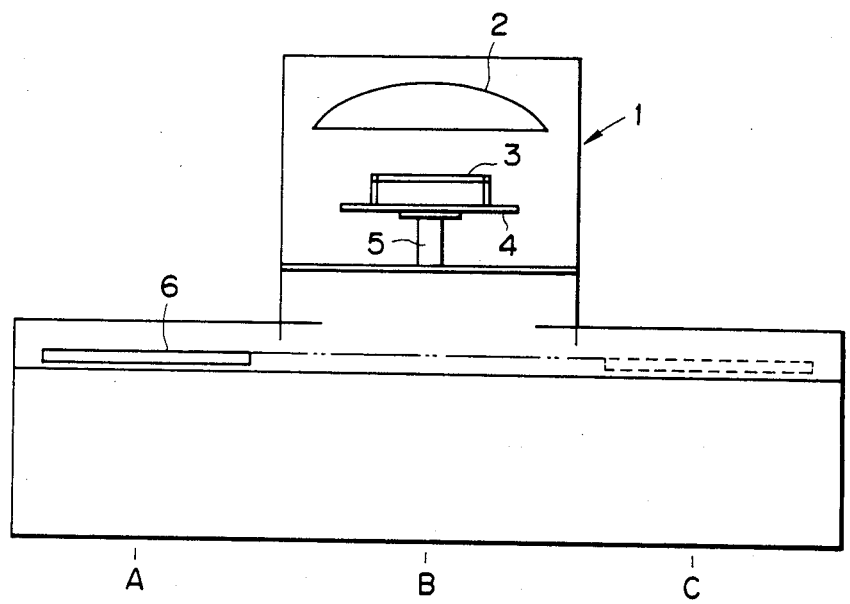
FIG. 1 is a front view illustrating the fundamental construction of a first embodiment of the present invention.

An exposure device in accordance with the present invention comprises an exposure light source 1 and an exposure stand which is reciprocably movable across an illuminated surface 9 formed by the exposure light source 1 and upon which is mounted an object to be exposed such as a photographic printing plate or a printed circuit board. The exposure light source 1 comprises a reflecting mirror 2 such as a parabolic reflecting mirror or a deformed elliptical reflecting mirror 2, a line light source 3 the center of which is located at the focal point of the reflecting mirror 2 and which is disposed in parallel with the illuminated surface and a light shielding plate 4 which is interposed between the line light source 3 and the illuminated surface 9, is formed integral with the line light source 3 and is adapted to shield the light which directly impinges upon the illuminated surface 9 from the light source 3 and the light emitted from the line light source 3, reflected by the reflecting mirror 2 and is made incident to the illuminated surface 9 at a large angle of incidence.

The assembly of the light source 3 and the shielding plate which constitute the exposure light source 1 is so mounted that it can be rotated about the center O of the line light source 3 and the flat surface of the shielding plate 4 is so defined that the integrated quantity of light incident at every point on the surface of the object 7 to be exposed becomes equal with each other.

Figure 3:
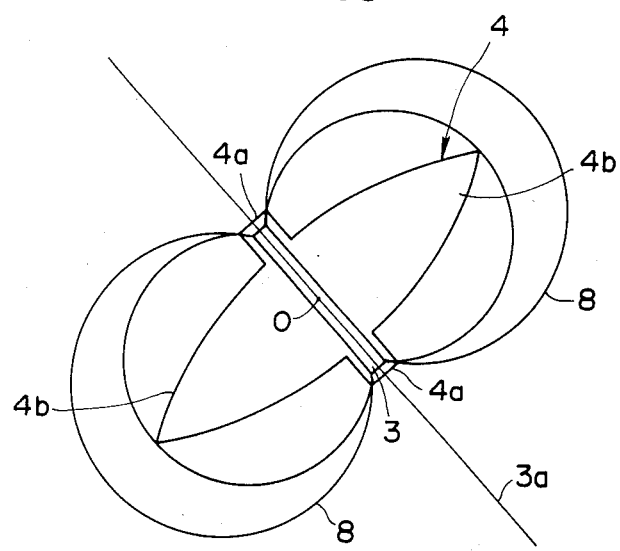
FIG. 3 is a top view illustrating a line light source of the first embodiment, an illumination distribution pattern obtained by the line light source, the configuration of an optical shielding plate and the positional relationship thereof relative to the line light source.

Since the line light source 3 has a predetermined length and a predetermined width, the illumination distribution 8 is not uniformly symmetrical about the the center of the line light source 3 and has a special pattern which is symmetrical about the axis 3a of the line light source 3 ( See FIG. 3). As a result, the illumination distribution on the illuminated surface 9 formed by the light emitted from the line light source 3 and reflected by the reflecting mirror 2 becomes nonuniform in accordance with the inherent illumination distribution pattern 8 of the line light source 3.

The configuration of the shielding plate 4 is defined in response to the non-uniform illumination distribution pattern on the illuminated surface 9. More particularly, it is defined based upon the results of calculation and experiments in such a way that when the object to be exposed 7 traverses the illuminated surface 9 as the exposure stand 6 is displaced, the integrated quantities of light incident at respective points on the surface of the object to be exposed 7 become substantially equal with each other.

That is, the shielding plate 4 has a shape adapted to interrupt not only part of the light rays incident to the illuminated surface 9 in order that the integrated quantities of the light rays incident to respective points on the surface of the object to be exposed 7 may become equal to each other, but also the light rays which are not suitable to expose the object to be exposed 7.

As described above, the shielding plate 4 interrupts not only the light rays incident directly on the illuminated surface 9 from the line light source 3, but also the reflected light rays incident on the illuminated surface 9 at large angles of incidence. In addition, the configuration of the shielding plate 4 is defined in such a way that the integrated quantities of light incident upon respective points on the surface of the object to be exposed 7 which traverses the illuminated surface become equal to each other. However, the illumination distribution pattern on the illuminated surface 9 is extremely complex and a configuration of the shielding plate 4 adapted to interrupt the unwanted light rays does not necessarily coincide with a configuration adapted to interrupt the light rays which cause an over-exposure. As a result, it is extremely difficult to make the integrated quantities of light incident to respective points on the surface of the object to be exposed 7 equal to each other by merely defining a configuration of the shielding plate 4.

Therefore, in order that the integrated quantities of light rays incident at respective points of the surface of the object to be exposed 7 may become equal to each other, the exposure device of the type described above is operated or controlled in the following manner.

First, prior to the exposure of the object to be exposed 7, the line light source 3 is rotated through a predetermined angle $\alpha$ with respect to the direction of the movement of the exposure stand 6.

Under this condition, the exposure stand 6 upon which is mounted the object to be exposed 7 is displaced from an initial position A through an exposure position B, thus traversing the illuminated surface 9, to an advanced position C so that the first exposure of the object to be exposed 7 is accomplished.

When the exposure stand 6 has been shifted to the advanced position C, the assembly of the line light source 3 and the shielding plate 4 is rotated through a predetermined angle $\beta$. Thereafter the exposure stand 6 is caused to return back to the initial position A, traversing the illuminated surface 9 so that the second exposure of the object to be exposed 7 is accomplished. Thus, the complete exposure of the object to be exposed 7 is attained.

During the exposure operation or control of the object to be exposed 7, the angle $\alpha$ of the first rotation of the line light source 3 and the angle $\beta$ of the second rotation thereof are so selected that the integrated quantities of light rays incident upon respective points on the surface of the object to be exposed 7 become equal to each other not only by the configuration of the light shielding plate 4 but also the rotation of the line light source 3.

That is, the illumination distribution pattern 8 formed by the line light source 3 is symmetrical about the optic axis 3a of the line light source 3 so that the illumination pattern 8 on the illuminated surface 9 tends to become substantially similar to the illumination distribution pattern 8 defined by the line light source 3. Therefore, if the line light source 3 is so disposed that the optic axis 3a thereof is in parallel with or perpendicular to the direction of the movement of the object to be exposed 7, the difference in integrated quantity of incident light is caused locally at respective portions of the surface of the object to be exposed 7 in the form of segments divided by the lines in parallel with the movement of the object to be exposed 7 not only by the influence caused by the fact that the illumination distribution on the illuminated surface 9 is not uniform but also the influence caused by the fact that the object to be exposed 7 is caused to move linearly while maintaining a predetermined posture.

Therefore, in order to eliminate the non-uniformity of the integrated quantities of light rays incident on respective points of the surface of the object to be exposed 7, the line light source 3 is initially rotated through the angle $\alpha$ with respect to the direction of the movement of the object to be exposed 7.

When the light source 7 is inclined by the angle $\alpha$ as discribed above, the illumination pattern on the illuminated surface 9 extends widely in the widthwise direction (that is, the direction perpendicular to the direction of the movement) of the object to be exposed 7 so that local differences in integrated quantity of light on the surface of the object to be exposed 7 can be reduced to a minimum.

As is apparent from the illumination distribution pattern 8 of the line light source 3 as shown in FIG. 3, when the line light source 3 is inclined by the angle $\alpha$ relative to the direction of the movement of the object to be exposed 7, the light reception region at which a quantity of light sufficient to expose the object to be exposed 7 is extended widely in the direction perpendicular to the optic axis 3a of the line light source 3. As a result, the light reception region of the illuminated surface 9 defined by the line light source 3 at which a sufficient quantity of light is received can be widely extended in the widthwise direction of the object to be exposed 7.

As described above, even though the line light source 3 is inclined at a predetermined angle $\alpha$ relative to the direction of the movement of the object to be exposed 7 so that the local differences in quantity of light incident on the surface of the object to be exposed 7 can be eliminated, the mere setting of this angle $\alpha$ cannot eliminate the local differences in illumination caused by unexpected factors due to the construction of the reflecting mirror 2 and the construction of the line light source 3.

In order to eliminate the differences in integrated quantity of light incident on the surface of the object to be exposed 7 caused by the unexpected difference in illumination, during the second exposure operation, the line light source 3 is rotated through the angle $\beta$ from the position at which the first exposure operation is accomplished. Therefore, a light ray which is incident at a predetermined point on the surface of the object to be exposed 7 during the first exposure operation is caused to fall at another point on the surface of the body to be exposed 7 during the second exposure operation so that an unexpected local region of the surface of the object to be exposed is prevented from receiving the integrated quantity of light different from that of light incident on the remaining region. As a result, the integrated quantities of light incident at respective points on the surface of the object to be exposed 7 become equal to each other.

The rotation through the angle $\beta$ of the line light source 3 is very effective in preventing the differences in integrated quantity of light among respective points of the surface of the object to be exposed 7. In addition, the following effect can be attained by the rotation through the angle $\beta$ of the line light source 3.

That is, the light rays which define the illuminated surface 9 are not incident perpendicular to the surface of the object to be exposed 7 and are inclined at some small angles. It is well known in the art that the resolution is considerably degraded when the object 7 is exposed by the light rays offset from the vertical.

Figure 2:
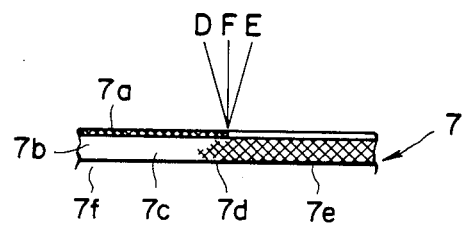
FIG. 2 is a fragmentary longitudinal sectional view, on enlarged scale, used to explain the effects of the exposure light rays incident on an object to be exposed.

Therefore, as shown in FIG. 2, an exposure light beam or ray which is radiated in the direction D at the object to be exposed 7 (comprising a substrate 7f, a photosensitive layer 7b and an origianl 7a arranged one over the other) in the forward stroke is switched to radiate at the object to be exposed 7 in the direction E opposite to the direction D with respect to the vertical direction F during the return stroke so that the average exposure light ray becomes perpendicular to the surface of the object to be exposed 7. This is the reason why the line light source 3 is rotated through the angle $\beta$ during the return stroke from the position at which the line light source 3 is maintained during the forward stroke.

Due to the rotation through the angle $\beta$ of the line light source 3, the photosensitive layer 7b has an unexposed portion 7c, a completely exposed portion 7e and a partially exposed portion 7d which exists at the boundary between the unexposed portion 7c and the completely exposed portion 7e and immediately below the peripheral edge of the original 7a. In the forward stroke, the exposure light rays fall at the partially exposed portion 7d not only in the direction D but also the vertical direction F while in the return stroke, the exposure light rays fall at the partially exposed portion 7d not only in the direction E but also the vertical direction F. As a result, one half of the partially exposed portion 7d on the side of the completely exposed portion 7e is completely exposed so that the completely exposed portion having the edge extended in the vertical direction F is defined.

Next an example of the present invention will be described. The assembly of the line light source 3 and the shielding plate 4 is mounted on the upper end of a rotating shaft 5 which is rotatable about its own axis relative to the main body of the exposure device and is held at a predetermined position stationary, and can be rotated through a predetermined angle by rotating the rotating shaft from the exterior.

The exposure stand is reciprocable. That is, the exposure stand 6 is advanced from its initial position A through the exposure position B immediately below the exposure light source 1 to the advanced position C and then retracted from the advanced position C through the exposure position B to the initial position A. Therefore, in the foward stroke (from the position A to the position the object to be exposed 7 mounted on the exposure stand 6 is subjected to the first exposure while in the return stroke it is subjected to the second exposure. Thus, the overall exposure of the object to be exposed 7 is accomplished.

Figure 4:
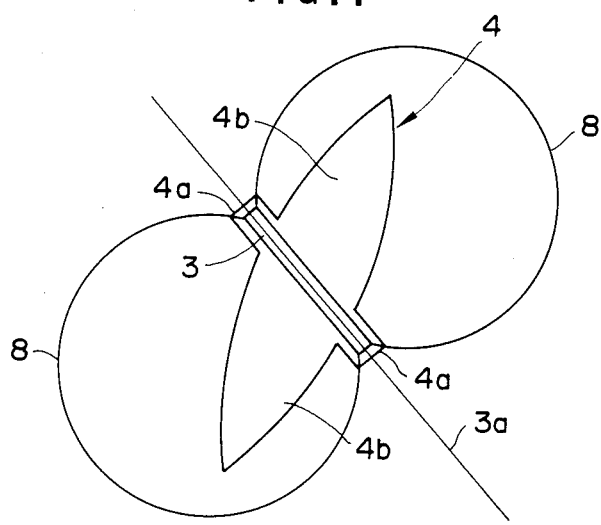
FIG. 4 is a top view illustrating a line light source of a second embodiment of the present invention, an illumination distribution pattern obtained by the line light source, the configuration of an optical shielding plate and the positional relationship thereof relative to the line source.

Referring to FIGS. 3 and 4, the shielding plate 4 comprises a first portion 4a which is adapted to interrupt the light rays emitted from the line light source and directly radiated toward the illuminated surface 9 and a second portion 4b which is adapted to interrupt the light rays incident on the illuminated surface at large angles of incidence and to eliminate the light rays whose quantity is in excess of the quantity of light required to expose the object to be exposed 7. The shielding plate 4 is interposed between the line light source 3 and the illuminated surface 9.

As is apparent from the object of the first portion 4a of the shielding plate 4, the first portion 4a is substantially similar in shape to the flat shape of the line light source 3. Therefore, it is very simple to define the shape of the first portion 4a. However, the second portion 4b of the shielding plate must interrupt not only the light rays incident at large angles of incidence but also the excessive light rays so that various experiments, measurements and calculations must be made in order to define the shape of the second portion 4b.

According to the results of the extensive experiments conducted by the inventors, it is preferable that the fundamental shape of the second portion 4b of the shielding plate 4 is in the form of a boat or ship as shown in FIG. 3 and that the longitudinal axis of the boat- or ship-like second portion 4b is perpendicular to the optic axis 3a of the line light source 3. A possible explanation why it is preferable that the second portion 4b is in the form of a boat or ship is that the undesired reflected light rays having a high degree of exposure intensity comprise the light rays emitted from the center portion of the line light source 3 and are distributed in a pattern substantially similar to the illumination distribution, pattern 8 of the line light source 3. Furthermore, the reason why it is preferable to maintain the longitudinal axis of the second portion 4b perpendicular to the optic axis of the line light source is that the illumination distribution pattern of the reflected light rays on the illuminated surface 9 is in conformity with the illumination distribution pattern of the line light source 3 as shown in FIG. 3 so that the quantity of light in the direction passing through the center of the illuminated surface 9 and perpendicular to the optic axis 3a of the light source 3 which is greater than the quantity of light arriving at the other portion of the illuminated surface 9 can be reduced.

However, it should be noted that the configuration of the shielding plate 4 and the posture of the second portion 4b thereof cannot be equally defined, but they are determined depending upon the luminous intensity of the line light source 3, the relationship between the size of the line light source 3 and the size of the illuminated surface 9, the traveling speed of the exposure stand 6, a required quantity of exposure light and so on. For instance, when a greater quantity of exposure light is needed, the position of the second portion 4b relative to the line light source 4 is slightly offset from the position at which the second portion 4b is perpendicular to the line light source 3 so that the shielding of a portion having a greater unit quantity of light is eliminated and consequently a greater quantity of light falls on the illuminated surface 9.

It should be noted that even when the second portion 4b of the shielding plate 4 is inclined relative to the optic axis 3a of the line light source 3, the position relative to the line light source 3 and configuration of the shielding plate 4 remain in mirror symmetry about the center O of the line light source 3.

Figure 5:
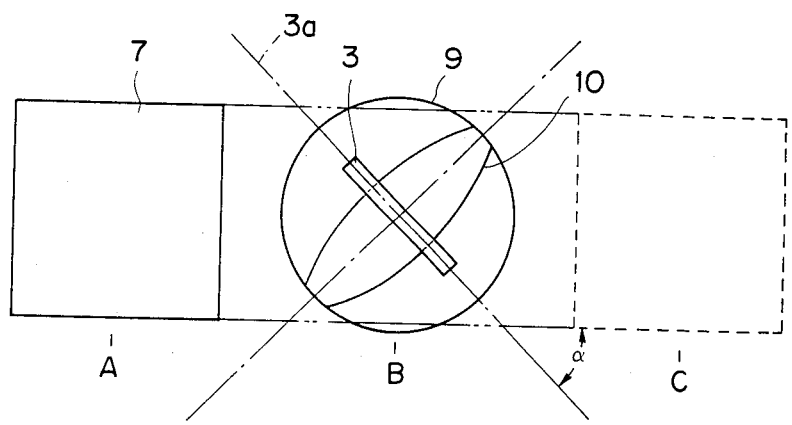
FIG. 5 is a top view illustrating a positional relationship among a line light source, an illuminated surface and a shielding shadow in the forward stroke of an exposure stand.
Figure 6:
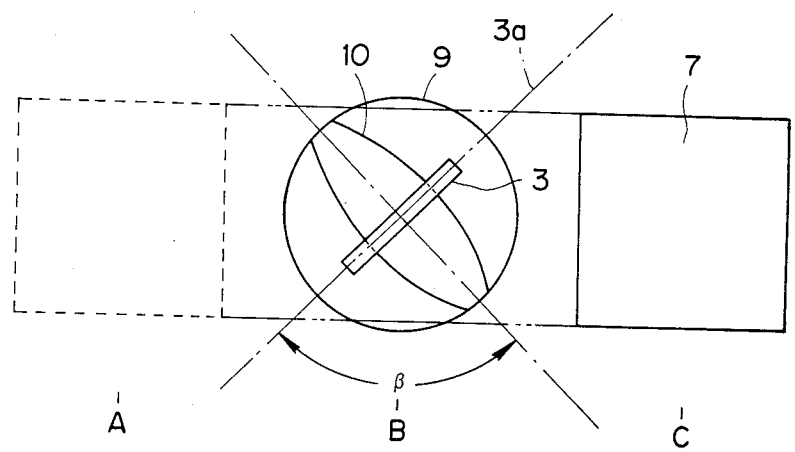
FIG. 6 is a view similar to FIG. 5, but illustrates a positional relationship in the return stroke of the exposure stand.

FIGS. 5 and 6 show the positional relationship of a shielding shadow 10 relative to the illuminated surface 9 when the embodiment as shown in FIG. 3 is used. FIG. 5 shows the case in which the angle α between the optic axis 3a of the line light source 3 and the direction of the movement of the exposure stand 6 and hence the object to be exposed 7 is 45° while FIG. 6 shows the case in which the assembly of the line light source 3 and the shielding plate 4 is rotated further through an angle of 90° from the position as shown in FIG. 5.

The reason why the initial angle α is 45° resides in the fact that the portion of the illuminated surface 9 which receives a less quantity of light; that is, the peripheral portion of the illuminated surface 9 immediately below the optic axis 3a of the line light source 3 and the portion of the illuminated surface 9 which receives a larger quantity of light; that is, the peripheral portion of the illuminated surface 9 at which the end portions of the shielding shadow 10 are located are brought into opposed relationship with the surface of the same object to be exposed 7 as the exposure stand 6 is displaced, whereby not only a portion of the surface of the object to be exposed 7 is prevented from receiving a less quantity of light, but also the integrated quantities of light incident on respective points on the surface of the object to be exposed 7 can be made substantially equal to each other.

The reason why the angle β of rotation of the line light source 3 is set to 90° is that it is so set in response to the initial angle α=45°. When the angle of rotation β is set to 90°, of all the quantity of light incident on the surface of the object to be exposed 7, one half is incident thereto in the return stroke from the direction different from the direction in which the other half of the quantity of light is incident in the forward stroke so that the local differences in quantity of incident light on the surface of the object to be exposed 7 can be eliminated. Upon rotation through 90° of the line light source 3, the position relative to the object to be exposed 7 of the line light source 3 becomes symmetrical about the direction perpendicular to the direction of displacement so that the average angle of incidence of the exposure light rays incident on the surface of the object to be exposed 7 can be made substantially perpendicular to the surface of the object to be exposed 7.

Figure 7:
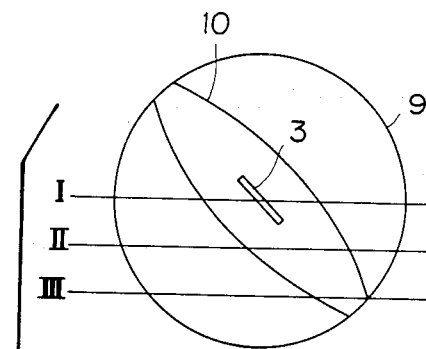
FIGS. 7(*a*) and (*b*) are top views illustrating the loci of predetermined points on an exposure stand in the forward and return strokes, respectively, thereof in a third embodiment of the present invention.
Figure 7:
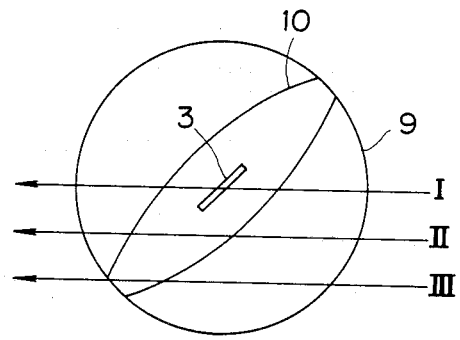

FIG. 7 shows the positional relationship between the line light source 3 and the shielding shadow 10 on a plane in the case when the position relative to the line light source 3 of the shielding plate is so selected that as many as light rays emitted from the line light source 3 can arrive at the illuminated surface 9 without being interrupted by the shielding plate 4. In this case, the first portion 4a of the shielding plate 4 is included in the second portion 4b thereof and the longitudinal axis of the shielding plate 4 is aligned with the optic axis 3a of the line light source 3.

Figure 8:
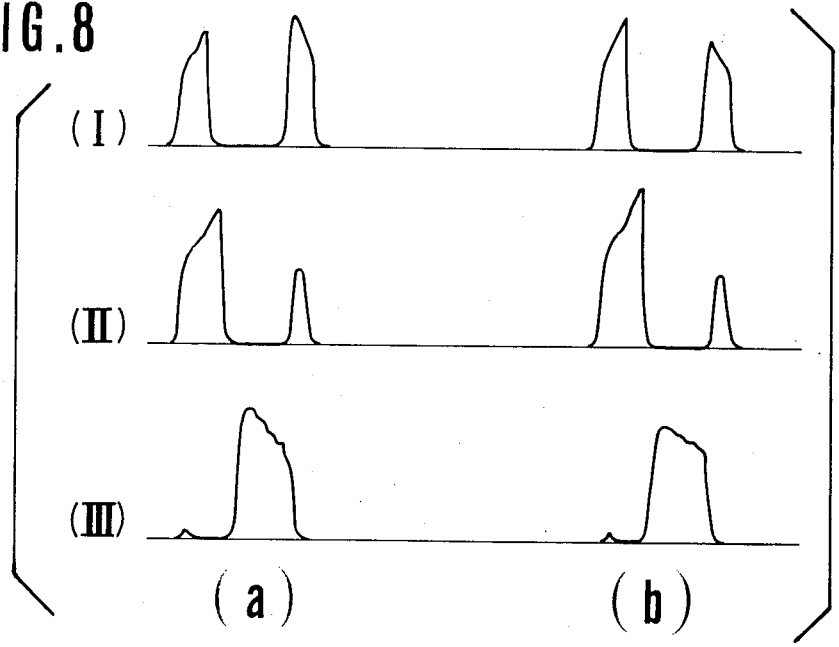
FIG. 8 shows the characteristic curves representing the quantities of light incident on the three predetermined points on the exposure stand when the latter is reciprocated as shown in FIGS. 7(a) and (b)

As in the case of the embodiment as shown in FIGS. 5 and 6, when the initial angle β of the assembly of the line light source 3 and the shielding plate 4 is selected at 45° and the angle of rotation β is selected at 90°, the quantities of light incident along predetermined lines I, II and III on the object to be exposed 7 are measured. The measurement results are characteristic curves as shown in FIG. 8 and it is seen from FIG. 8 that the integrated quantities of light incident on the lines I, II and III are substantially equal to each other. FIGS. 7(a) and 8(a) illustrate the forward stroke while FIGS. 7(b) and 8(b) illustrate the return stroke. The line I is extended immediately below the center O of the line light source 3; the line III is extended along the edge of the exposure stand 6; and the line II is extended through a midpoint between the lines I and III and in parallel with the lines I and III.

Figure 9:
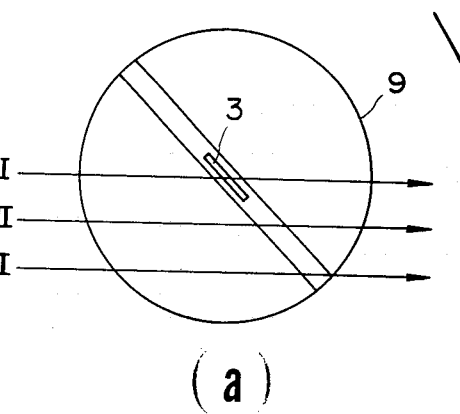
FIG. 9 shows the loci of three predetermined points on an exposure stand when the latter is reciprocated in the case in which no optical shielding plate is provided for the sake of comparison with the present invention.
Figure 9:
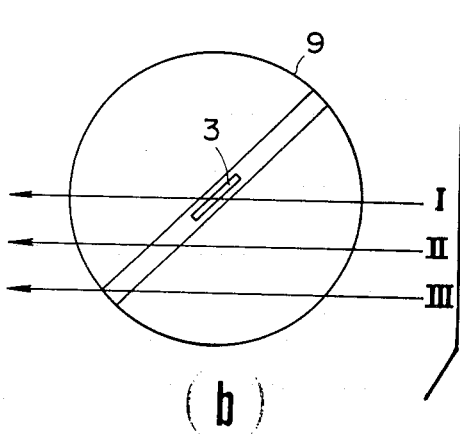
Figure 10:
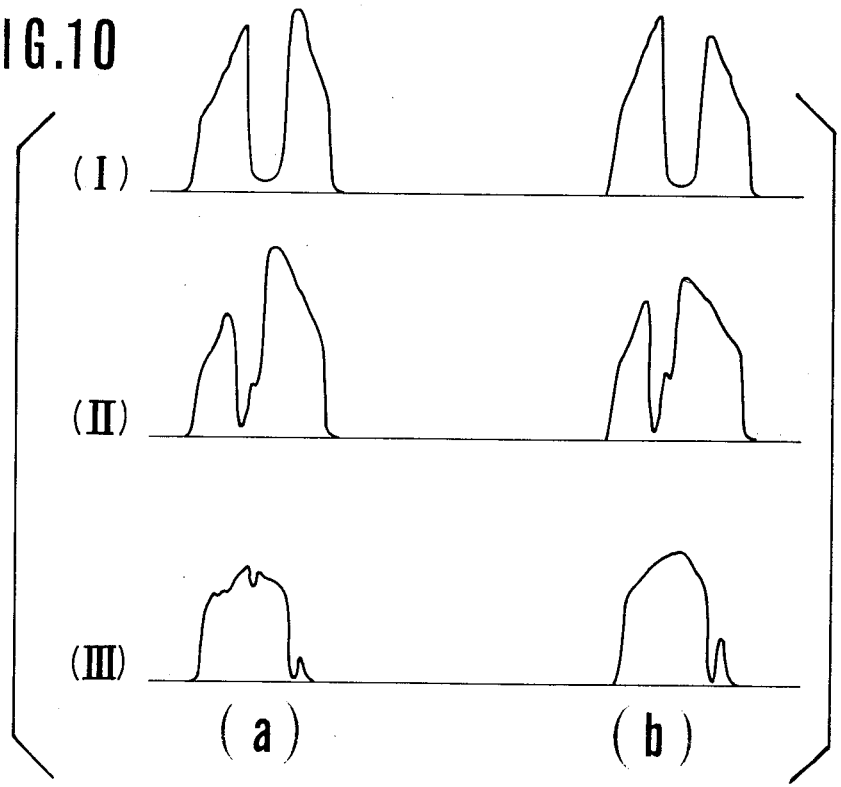
FIG. 10 shows the characteristic curves representing the quantities of light incident on the three predetermined points on the exposure stand when the latter is reciprocated as shown in FIG. 9.

FIGS. 9 and 10 show a case in which only the first portion 4a of the shielding plate 4 is combined with the line light source 3 so that the light rays emitted from the line light source 3 and directly incident on the illuminated surface 9 are interrupted. In FIG. 9, lines I, II and III are selected in a manner substantially similar to that described above with reference to FIG. 7. When only the first portion 4a of the shielding plate 4 is combined with the line light source 3, it is seen that the integrated quantity of light incident along the line III is by far smaller than the integrated quantity of light incident along the line II.

Figure 11:
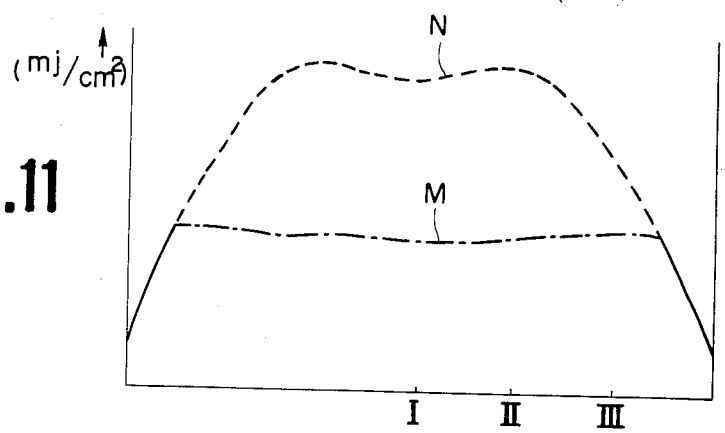
FIG. 11 shows the characteristic curve M representing the distribution of the quantity of light incident upon the surface of an exposure stand when an optical shielding plate is provided in accordance with the present invention and the characteristic curve N representing the distribution of the quantity of light incident upon the surface of an exposure stand when no optical shielding plate is provided.

FIG. 11 shows the characteristic curves each representing the integrated quantity of light incident on the exposure stand 7, the characteristic curves being obtained from the results of measurement as shown in FIGS. 8 and 10.

In FIG. 11, the characteristic curve M shows the integrated quantity of light obtained in the case of the embodiment of the present invention while the characteristic curve N shows the integrated quantity of incident light obtained in the case of FIG. 9. It is apparent from FIG. 11 that the characteristic curve M is almost flat so that it is seen that the quantities of light rays incident at respective points of the upper surface of the exposure stand 7 are substantially equal to each other.

So far the present invention has been described in conjunction with the exposure of one major surface of the object to be exposed 7, but it is to be understood that the present invention is not limited thereto and that the present invention may equally is applied when both the major surfaces of the object to be exposed 7 are exposed.

As described above, according to the present invention, the shielding plate 4 is adapted to interrupt not only the light rays radiated directly from the line light source 3 to the illuminated surface 9, but also the light rays falling on the illuminated surface 9 at greater angles of incidence as well as excessive exposure light rays is combined integral with the line light source 3. Therefore, even though the line light source 3 is used, the integrated quantities of light rays incident at respective points of the surface of the object to be exposed 7 can be made substantially equal to each other.

In addition, according to the present invention, the object to be exposed 7 is reciprocated relative to the line light source 3 when the former is exposed so that the adjacent points in the direction of the displacement of the surface of the object to be exposed 7 can always receive a uniform integrated quantity of incident light. As a result, all of the points on the surface of the object to be exposed 7 can receive a uniform quantity of incident light.

Furthermore, according to the present invention, the initial angle α of the line light source 3 relative to the object to be exposed 7 can be freely selected and the line light source 3 is further rotated through an angle β in the return stroke so that every point on the surface of the object to be exposed 7 can receive a more uniform quantity of incident light. As a result, the best exposure can be attained all the time.

Moreover, according to the present invention, the initial angle α of the line light source 3 relative to the object to be exposed 7 is maintained in the forward stroke and the line light source 3 is further rotated through an angle β in the return stroke, so that even when the incident rays are slightly inclined relative to the vertical, the average angle of incidence becomes perpendicular to the surface of the object to be exposed 7. As a result, the exposure with a higher degree of resolution can be attained.

Furthermore, according to the present invention, the shielding plate 4 is assembled integral with the line light source 3 and the assembly consisting of the line light source 3 and the shielding plate 4 is rotatable when the exposure stand 6 is displaced. As a result, the exposure device in accordance with the present invention can be made very simple in construction. In addition, in operation, the exposure stand 6 is reciprocated while the assembly of the light source 3 and the optical shielding plate 4 is rotated through an angle β so that the operation of the exposure device in accordance with the present invention is very simple.

As described above, according to the present invention, even though the line light source is used, every point on the surface of the object to be exposed can receive a substantially uniform quantity of incident light. As a result, not only the high-quality exposure can be attained but also an extremely high resolution can be obtained. The exposure device in accordance with the present invention is simple in construction so that it can be made compact in size and light in weight and can be manufactured at less costs. Moreover, no skilled operator is needed to operate the exposure device of the present invention and anyone can correctly and positively operate the exposure device of the present invention.

What is claimed is:

1. An exposure device comprising
an exposure stand upon which is mounted an object to be exposed and which is reciprocably movable across an illuminated surface defined by an exposure light source;
said exposure light source comprising a reflecting mirror such as a parabolic reflecting mirror or a deformed elliptical reflecting mirror, a line light source disposed in parallel with said illuminated surface and extending through the focal point of said reflecting mirror; an optical shielding plate formed integrally with said line light source and interposed between said line light source and said illuminated surface; said optical shielding plate having a predetermined configuration for interrupting light rays emitted from said line light source directly toward said illuminated surface and also interrupting reflected rays directed at greater than the desired angle of incidence;
an assembly of said line light source and said optical shielding plate being rotatable relative to said illuminated surface; and
the configuration of said optical shielding plate being so defined that the integrated quantities of light incident at every point on the surface of said object to be exposed become substantially equal to each other.

2. An exposure control method comprising the steps of
maintaining a line light source and an optical shielding plate at a position inclined at a predetermined angle relative to the direction of the movement of an exposure stand,
advancing said exposure stand with an object to be exposed mounted thereon across a surface illuminated by said line light source, rotating an assembly of said line light source and said optical shielding plate through a predetermined angle after said exposure stand has been advanced, retracting said exposure stand across said illuminated surface, thereby accomplishing the expousre of said object to be exposed, and selecting the angle of inclination of said line light source relative to the direction of the movement of said exposure stand and the angle of rotation of said assembly of said line light source and said optical shielding plate in accordance with the configuration of said optical shielding plate so that the integrated quantities of light incident at every point of the surface of said object to be exposed become equal to each other.

3. An exposure device as set forth in claim 1 wherein the top view of said optical shielding plate is in the form of a boat or ship.

4. An exposure control method as set forth in claim 2 wherein said angle of inclination of said line light source relative to said direction of the movement of said exposure stand is 45° and said angle of rotation of said assembly of said line light source and said optical shielding plate is 90°.

* * * * *